United States Patent
Tsujita et al.

(10) Patent No.: US 10,606,002 B2
(45) Date of Patent: Mar. 31, 2020

(54) OPTO-ELECTRIC HYBRID BOARD AND MANUFACTURING METHOD FOR SAME

(71) Applicant: NITTO DENKO CORPORATION, Ibaraki-shi, Osaka (JP)

(72) Inventors: Yuichi Tsujita, Ibaraki (JP); Naoyuki Tanaka, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 15/512,963

(22) PCT Filed: Sep. 10, 2015

(86) PCT No.: PCT/JP2015/075678
§ 371 (c)(1),
(2) Date: Mar. 21, 2017

(87) PCT Pub. No.: WO2016/047447
PCT Pub. Date: Mar. 31, 2016

(65) Prior Publication Data
US 2017/0299823 A1    Oct. 19, 2017

(30) Foreign Application Priority Data

Sep. 24, 2014 (JP) ................................ 2014-193812
Jun. 18, 2015 (JP) ................................ 2015-122725

(51) Int. Cl.
*G02B 6/42* (2006.01)
*G02B 6/43* (2006.01)
(Continued)

(52) U.S. Cl.
CPC ............. *G02B 6/428* (2013.01); *G02B 6/122* (2013.01); *G02B 6/43* (2013.01); *H05K 1/02* (2013.01);
(Continued)

(58) Field of Classification Search
CPC ...... G02B 6/122; G02B 6/4214; G02B 6/428; G02B 6/4283; G02B 6/4293; G02B 6/3817
See application file for complete search history.

(56) References Cited

U.S. PATENT DOCUMENTS 7,284,322 B2    10/2007 Naitou et al.
8,388,239 B2    3/2013 Hodono
(Continued)

FOREIGN PATENT DOCUMENTS

JP    2006-156439 A    6/2006
JP    2013-195533 A    9/2013
(Continued)

OTHER PUBLICATIONS

International Search Report dated Dec. 1, 2015, issued in counterpart International Application No. PCT/JP2015/075678 (2 pages).
(Continued)

*Primary Examiner* — Sung H Pak
*Assistant Examiner* — Hoang Q Tran
(74) *Attorney, Agent, or Firm* — Westerman, Hattori, Daniels & Adrian, LLP

(57) ABSTRACT

An opto-electric hybrid board includes an electric circuit board in which electric wiring is formed on a front surface of an insulating layer, and an optical waveguide formed on the rear side of the electric circuit board. The optical waveguide and the electric circuit board are arranged so that left and right edges of the electric circuit board along a longitudinal direction of the optical waveguide overlap with left and right edges of the optical waveguide when viewed from above, or so that the left and right edges of the electric circuit board are on the inside of where the left and right edges of the optical waveguide are located. The opto-electric hybrid board is easy to handle owing to the reduced chance
(Continued)

of the electric circuit board being damaged. The opto-electric hybrid board also does not cause misalignment of a core when used as a connector.

10 Claims, 15 Drawing Sheets

(51) Int. Cl.
| | | |
|---|---|---|
| H05K 3/00 | (2006.01) | |
| G02B 6/122 | (2006.01) | |
| H05K 1/02 | (2006.01) | |
| G02B 6/138 | (2006.01) | |
| G02B 6/136 | (2006.01) | |

(52) U.S. Cl.
CPC ........... *H05K 3/0032* (2013.01); *G02B 6/136* (2013.01); *G02B 6/138* (2013.01); *G02B 6/4214* (2013.01); *H05K 2201/09154* (2013.01); *H05K 2201/10121* (2013.01)

(56) References Cited

U.S. PATENT DOCUMENTS

| | | | |
|---|---|---|---|
| 8,768,114 B2 | 7/2014 | Tsujita et al. | |
| 8,837,874 B2 | 9/2014 | Tsujita et al. | |
| 9,146,348 B2 | 9/2015 | Nakashiba et al. | |
| 9,274,273 B2 | 3/2016 | Masuda et al. | |
| 9,297,958 B2 | 3/2016 | Tsujita et al. | |
| 2006/0120658 A1 | 6/2006 | Naitou et al. | |
| 2006/0133718 A1* | 6/2006 | Liu | G02B 6/43 385/14 |
| 2007/0019914 A1* | 1/2007 | Ohtsu | G02B 6/1221 385/89 |
| 2009/0297096 A1* | 12/2009 | Hodono | G02B 6/4214 385/14 |
| 2010/0129036 A1* | 5/2010 | Hodono | B32B 38/1841 385/88 |
| 2013/0243370 A1* | 9/2013 | Tsujita | G02B 6/43 385/14 |
| 2013/0287335 A1 | 10/2013 | Nakashiba et al. | |
| 2013/0301980 A1 | 11/2013 | Tsujita et al. | |
| 2013/0315543 A1 | 11/2013 | Tseng | |
| 2014/0126857 A1 | 5/2014 | Masuda et al. | |
| 2014/0147076 A1 | 5/2014 | Tsujita et al. | |
| 2015/0139589 A1* | 5/2015 | Sakai | G02B 6/3807 385/76 |
| 2015/0234125 A1* | 8/2015 | Sakai | G02B 6/32 385/14 |

FOREIGN PATENT DOCUMENTS

| | | |
|---|---|---|
| JP | 2013-235104 A | 11/2013 |
| JP | 2014-95782 A | 5/2014 |
| JP | 2014-106355 A | 6/2014 |
| JP | 2014-115480 A | 6/2014 |
| TW | 201348783 A | 12/2013 |
| WO | 2012/093462 A1 | 7/2012 |
| WO | 2014/020730 A1 | 2/2014 |

OTHER PUBLICATIONS

Notification of Transmittal of Translation of the International Preliminary Report on Patentability (Form PCT/IB/338) issued in counterpart International Application No. PCT/JP2015/075678 dated Apr. 6, 2017, with Forms PCT/IB/373 and PCT/ISA/237. (12 pages).
Office Action dated Dec. 27, 2018, issued in counterpart Chinese application No. 201580051529.9, with English translation. (13 pages).
Office Action dated Feb. 5, 2019, issued in counterpart Japanese application No. 2015-122725, with English tranlsation. (7 pages).
Office Action dated Dec. 7, 2018, issued in counterpart Taiwanese application No. 104129953, with English translation. (10 pages).
Office Action dated Jul. 3, 2019, issued in counterpart CN application No. 201580051529.9, with English translation. (12 pages).
Office Action dated Sep. 24, 2019, issued in counterpart JP application No. 2015-122725, with English translation. (5 pages).

* cited by examiner

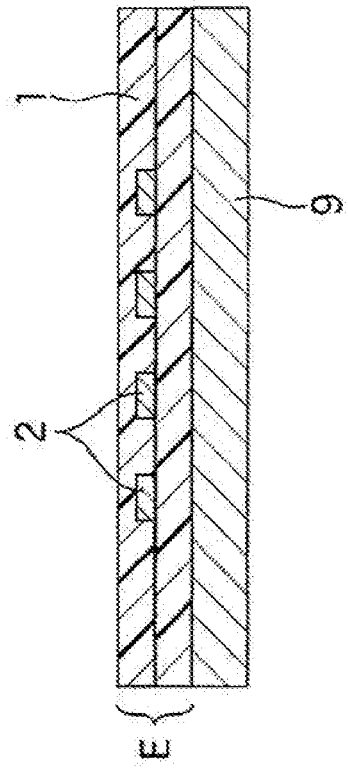
FIG.3A
FIG.3B
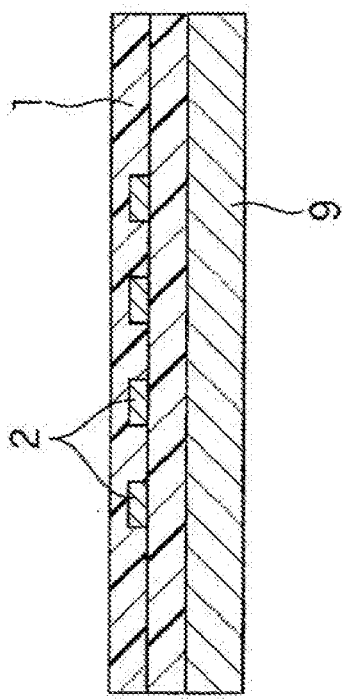
FIG.3C
FIG.3D

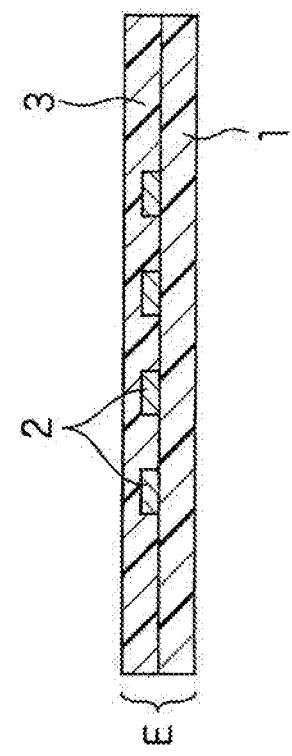
FIG.4B
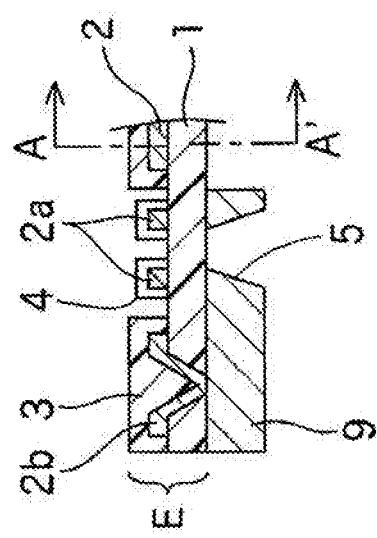
FIG.4A
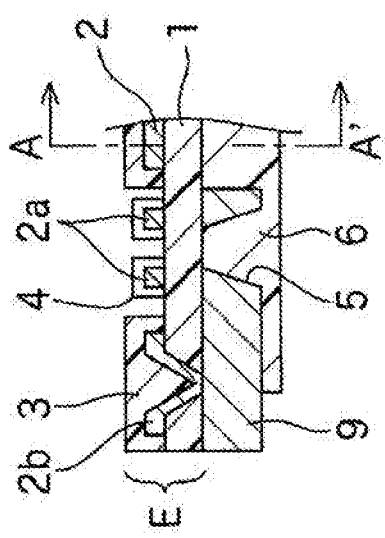
FIG.4D
FIG.4C

RELATED ART

OPTO-ELECTRIC HYBRID BOARD AND MANUFACTURING METHOD FOR SAME

TECHNICAL FIELD

The present disclosure relates to an opto-electric hybrid board in which an electric circuit board and an optical waveguide are stacked, and a method of manufacturing the opto-electric hybrid board.

BACKGROUND ART

Recent electronic devices deal with the increased amount of transmitted information by employing an optical interconnect in addition to electric wiring, and opto-electric hybrid boards capable of transmitting an electric signal and an optical signal at the same time are used in many cases. An example of known opto-electric hybrid boards has the structure illustrated in FIG. 17, where an insulating layer 1 made of polyimide or the like serves as a substrate. Electric wiring 2, which is a conductive pattern, is provided on a front surface of the insulating layer 1, thereby forming an electric circuit board E. An optical waveguide W is provided on the rear side of the electric circuit board E to be optically coupled to an optical device that is installed at a given point in the electric wiring 2. The front surface of the electric circuit board E is insulated and protected by a coverlay 3. The optical waveguide W is made up of three layers: an under cladding layer 6, a core 7 serving as a path along which light travels, and an over cladding layer 8.

Applications of the opto-electric hybrid board described above (an opto-electric hybrid board 10) include installing the opto-electric hybrid board 10 in an electronic device as it is, and using the opto-electric hybrid board 10 that is formed into a ribbon shape and that has a photoelectric connection ferrule mounted to a front end of the belt as a connector configured to connect one board to another board or one chip to another chip on a board.

As illustrated in FIG. 17, the opto-electric hybrid board 10 in general is shaped so that left and right edge portions of the electric circuit board E (portions surrounded by dot-dash lines X in FIG. 17) protrude farther outward than left and right edge portions of the optical waveguide W on both sides along the longitudinal direction of the optical waveguide W. This is due to how the opto-electric hybrid board 10 is usually manufactured, that is, the electric circuit board E is created first and then the under cladding layer 6, the core 7, and the over cladding layer 8 are formed and stacked in the order stated on a rear surface of the electric circuit board E (namely, the rear surface of the insulating layer 1 made of polyimide or other materials) in a given pattern by photolithography or other methods. It is a common technical practice to form the optical waveguide W so that the outline of the optical waveguide W is contained inside the rear surface shape of the electric circuit board E because the pattern is formed by removing unnecessary portions after flat layers are formed. This is also practiced in some of general optical waveguides proposed, and such optical waveguides are formed to have a size smaller than a substrate having one side on which the optical waveguides are formed (see JP-A-2014-115480).

RELATED ART DOCUMENT

Patent Document

PTL 1: JP-A-2014-115480

SUMMARY OF INVENTION

However, with the opto-electric hybrid board 10 shaped as illustrated in FIG. 17, where the left and right edge portions of the electric circuit board E protrude farther outward than the left and right edge portions of the optical waveguide W, the protruding portions are likely to bump into a conveyance guide or the like when the product is tested, conveyed, or transported. The impact can cause a tear or a chip that invites a problem of drop in quality, e.g., the rusting of the electric wiring 2 from moisture absorption. In the opto-electric hybrid board 10 that is flexible throughout, in particular, the electric circuit board E is very thin, and hence the protruding portions are especially vulnerable to damage.

Using the opto-electric hybrid board 10 as a connector requires the work of fitting a front end portion of the opto-electric hybrid board 10 into a recessed portion 11a of a ferrule 11 and fixing the front end portion as illustrated in FIG. 18A. When the recessed portion 11a is designed so that its opening is allowed a relatively large clearance with respect to the contour of the electric circuit board E, the core 7 cannot be positioned accurately on the inside of the recessed portion 11a, which results in a problem of improper optical coupling by the connector.

In order to position the core 7 accurately, the opposite approach may be taken in which the opening of the recessed portion 11a of the ferrule 11 is allowed a minimum clearance with respect to the contour of the electric circuit board E. In this case, however, the protruding portions of the electric circuit board E can easily get caught on the opening edge of the recessed portion 11a as illustrated in FIG. 18B when the front end of the opto-electric hybrid board 10 is fit into the recessed portion 11a, and the unsmooth fitting means poor workability.

The present disclosure has been made in view of the circumstances described above, and an object is to provide an opto-electric hybrid board that is easy to handle owing to the reduced chance of an electric circuit board portion being damaged, and a method of manufacturing the opto-electric hybrid board.

In order to achieve the object described above, according to a first gist, there is provided an opto-electric hybrid board, including: an electric circuit board including an insulating layer and electric wiring, which is formed on a front surface of the insulating layer; and an optical waveguide including a cladding layer and a core, the optical waveguide being formed on a rear side of the electric circuit board, in which the electric circuit board and the optical waveguide are configured so that left and right edges in a longitudinal direction of the electric circuit board that run along a longitudinal direction of the optical waveguide overlap with left and right edges in the longitudinal direction of the optical waveguide when viewed from above, or so that the left and right edges of the electric circuit board are on an inside of where the left and right edges of the optical waveguide when viewed from above.

Further, in particular, according to a second gist, in the above-mentioned opto-electric hybrid board, the optical waveguide is set to have a thickness greater than a thickness of the electric circuit board. In particular, according to a third gist, in the above-mentioned opto-electric hybrid board, the electric circuit board is set to have a thickness of from 3 μm to 200 μm, and the optical waveguide is set to have a thickness of from 20 μm to 500 μm.

In addition, in particular, according to a fourth gist, in the above-mentioned opto-electric hybrid board, the core includes a portion that is surrounded by the cladding layer, and portions that are exposed on left and right side surfaces of the optical waveguide along the longitudinal direction of the optical waveguide and that serve as a positioning guide. In particular, according to a fifth gist, in the above-mentioned opto-electric hybrid board, the core includes a portion that is surrounded by the cladding layer, and portions that are exposed on left and right side surfaces of the optical waveguide along the longitudinal direction of the optical waveguide, that cover left and right side surfaces of the electric circuit board located above the optical waveguide, and that serve as a positioning guide.

Further, according to a sixth gist, there is provided a method of manufacturing an opto-electric hybrid board, including: preparing an electric circuit board, the electric circuit board including an insulating layer and an electric wiring which is formed on a front surface of the insulating layer; and forming an optical waveguide on a rear side of the electric circuit board, the optical waveguide including a cladding layer and a core, in which the forming of the optical waveguide on the rear side of the electric circuit board includes forming the optical waveguide so that the optical waveguide has a shape in which left and right edges in a longitudinal direction of the electric circuit board that run along a longitudinal direction of the optical waveguide protrude farther outward than left and right edges in the longitudinal direction of the optical waveguide when viewed from above, and then performing laser irradiation from above the electric circuit board to process and remove left and right edge portions in the longitudinal direction of the electric circuit board that run along the longitudinal direction of the optical waveguide, thereby forming the optical waveguide and the electric circuit board so that the left and right edges in the longitudinal direction of the electric circuit board overlap with the left and right edges of the optical waveguide when viewed from above, or are on an inside of the left and right edges of the optical waveguide.

Further, in particular, according to a seventh gist, in the above-mentioned method of manufacturing an opto-electric hybrid board, the optical waveguide is set to have a thickness greater than a thickness of the electric circuit board. In particular, according to an eighth gist, in the above-mentioned method of manufacturing an opto-electric hybrid board, the electric circuit board is set to have a thickness of from 3 µm to 200 µm, and the optical waveguide is set to have a thickness of from 20 µm to 500 µm.

In addition, in particular, according to a ninth gist, in the above-mentioned method of manufacturing an opto-electric hybrid board, the core includes a portion that is surrounded by the cladding layer, and portions that are exposed on left and right side surfaces of the optical waveguide along the longitudinal direction of the optical waveguide and that serve as a positioning guide.

Further, according to a tenth gist, there is provided a method of manufacturing an opto-electric hybrid board, including: preparing an electric circuit board, the electric circuit board including an insulating layer and an electric wiring which is formed on a front surface of the insulating layer; and forming an optical waveguide on a rear side of the electric circuit board, the optical waveguide including a cladding layer and a core, in which the forming of the optical waveguide on the rear side of the electric circuit board includes forming a support layer, at least before the core is formed, on a front side of the electric circuit board so that the support layer has a shape in which the support layer viewed from above protrudes farther outward than left and right edges in a longitudinal direction of the electric circuit board that run along a longitudinal direction of the optical waveguide, forming portions on a rear side of the support layer that protrude farther outward than the left and right edges in the longitudinal direction of the electric circuit board as portions that are exposed on left and right side surfaces in the longitudinal direction of the optical waveguide that cover left and right side surfaces of the electric circuit board located above the optical waveguide and that serve as a positioning guide, and then removing the support layer from the electric circuit board.

In the present disclosure, "viewed from above" means looking straight down at the front side of the electric circuit board where the optical waveguide is provided on the rear side.

Each opto-electric hybrid board of the present disclosure in which the electric circuit board and the optical waveguide are stacked on top of each other is shaped so that the left and right sides of the electric circuit board do not protrude sideways from the left and right sides of the optical waveguide by the arrangement in which the left and right edges of the electric circuit board and the left and right edges of the optical waveguide overlap each other along the longitudinal direction of the optical waveguide when viewed from above, or the arrangement in which the left and right surfaces of the electric circuit board are on the inside of where the left and right edges of the optical waveguide are located.

This shape is free from the problems of the related art in which the relatively thin electric circuit board protrudes farther than the optical waveguide on the rear side and is consequently damaged from impact, and the core of the opto-electric hybrid board that is fit into a ferrule to be used as a connector is misaligned. The resultant advantages are the ease of handling and stable quality.

Of the opto-electric hybrid boards, ones in which the optical waveguide is set thicker than the electric circuit board, in particular, ones in which the thickness of the electric circuit board is from 3 µm to 200 µm and the thickness of the optical waveguide is from 20 µm to 500 µm, have greater practical effects because, despite being relatively thin and flexible throughout, there is no fear that the opto-electric hybrid boards will receive an impact on the electric circuit board and there is no fear of core misalignment when used as a connector unlike the related art.

Of the opto-electric hybrid boards, ones in which the core formed in the optical waveguide includes the portion that is surrounded by the cladding layer and the portions that are exposed on the left and right side surfaces of the optical waveguide along the longitudinal direction of the optical waveguide and that serve as the positioning guide, or ones in which the core includes the portion that is surrounded by the cladding layer and the portions that are exposed on the left and right side surfaces of the optical waveguide along the longitudinal direction of the optical waveguide and that cover left and right side surfaces of the electric circuit board located above the optical waveguide, and that serve as a positioning guide, are capable of positioning with high precision a core portion along which light travels when used as a connector or the like, because the positioning with an element to which the connector is connected uses a core end surface that is formed by the same process and the same standard as those of the core portion along which light travels.

The opto-electric hybrid board manufacturing methods according to the sixth to ninth gists have an advantage of being economical and high in manufacturing efficiency because the opto-electric hybrid boards of the first to fourth gists which have a special shape can readily be obtained by simply removing a part of the left and right sides of the electric circuit board through laser irradiation in the last step of a process that is mostly the same as the process of the related art.

The opto-electric hybrid board manufacturing method according to the tenth gist has an advantage of being economical and high in manufacturing efficiency because the opto-electric hybrid board of the fifth gist which has a special shape can readily be obtained by simply removing the support layer, which is provided on the front side of the electric circuit board, after the core of the optical waveguide is formed so as to cover the left and right side surfaces of the electric circuit board.

BRIEF DESCRIPTION OF DRAWINGS

FIG. 3A is again an explanatory diagram for illustrating a step of manufacturing the electric circuit board, FIG. 3B is an explanatory sectional view taken along the line A-A' of FIG. 3A, FIG. 3C is again an explanatory diagram for illustrating a step of manufacturing the electric circuit board, and FIG. 3D is an explanatory sectional view taken along the line A-A' of FIG. 3C.

FIG. 4A is an explanatory diagram for illustrating a step of manufacturing an optical waveguide in a method of manufacturing the opto-electric hybrid board, FIG. 4B is an explanatory sectional view taken along the line A-A' of FIG. 4A, FIG. 4C is again an explanatory diagram for illustrating a step of manufacturing the optical waveguide, and FIG. 4D is an explanatory sectional view taken along the line A-A' of FIG. 4C.

DESCRIPTION OF EMBODIMENTS

Now, embodiments of the present disclosure are described in detail.

Figure 1A:
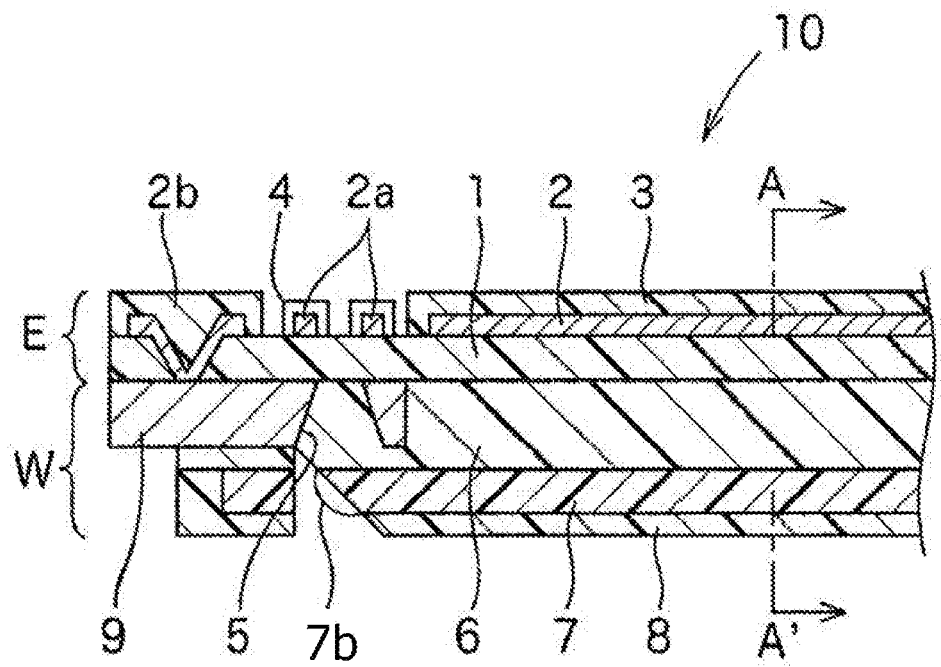
FIG. 1A is a partial vertical sectional view for schematically illustrating an opto-electric hybrid board according to an embodiment of the present disclosure.
Figure 1B:
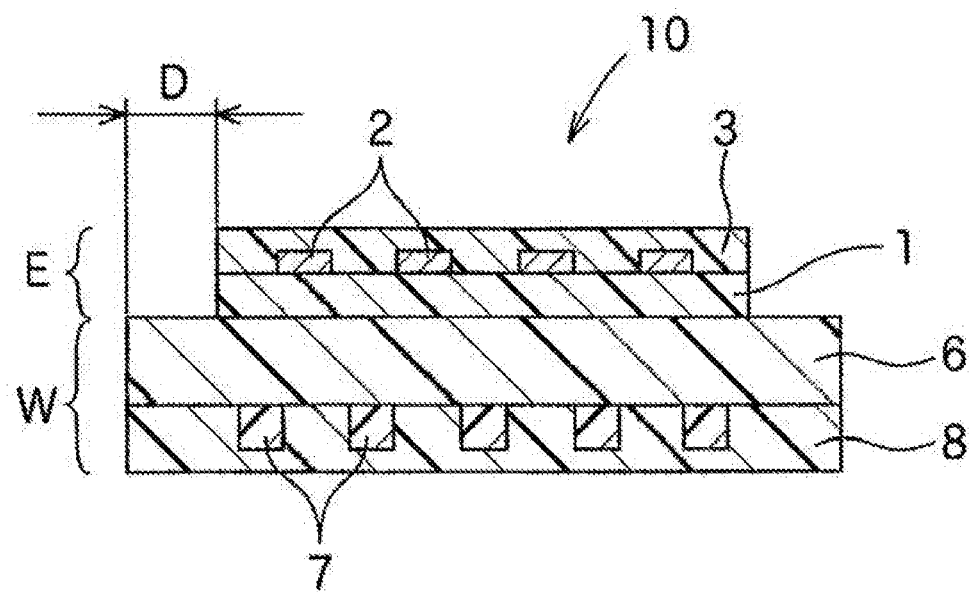
FIG. 1B is a sectional view taken along the line A-A' of FIG. 1A.

FIG. 1A is a partial vertical sectional view for schematically illustrating an opto-electric hybrid board according to an embodiment of the present disclosure. FIG. 1B is a sectional view taken along the line A-A' of FIG. 1A. An opto-electric hybrid board 10 of FIG. 1A and FIG. 1B includes an electric circuit board E in which electric wiring 2 is provided on a front surface of an insulating layer 1 and an optical waveguide W, which is provided on the rear side of the insulating layer 1.

The electric wiring 2 of the electric circuit board E is formed on the front surface of the insulating layer 1, which is made of polyimide or other materials, and includes, among others, an optical element installation pad 2a, an earth electrode 2b, pads for installing various other elements, and a connector installation pad (not shown). The components of the electric wiring 2 excluding the pad 2a and others are insulated and protected by a coverlay 3, which is made of polyimide or other materials. The front surfaces of the pad 2a and others are covered with an electrolytic plating layer 4, which is made of gold, nickel, or other materials.

The optical waveguide W provided on the rear side of the insulating layer 1 is made up of an under cladding layer 6, a core 7, which is formed in a given pattern on a front surface (the bottom surface in FIG. 1) of the under cladding layer 6, and an over cladding layer 8, which covers the core 7 to be unitary with the front surface of the under cladding layer 6. A metal layer 9 is provided on the rear surface of the insulating layer 1 in order to reinforce the opto-electric hybrid board 10, and is formed in a pattern in portions excluding ones where flexibility is required. A through hole 5 for securing a light path between the core 7 and the optical element is formed in the metal layer 9. The under cladding layer 6 extends to the interior of the through hole 5.

A portion of the core 7 that corresponds to the optical element installation pad 2a of the electric circuit board E is formed on a slope that is at an angle of 45° to the longitudinal direction of the core 7. The slope serves as a light reflecting surface 7b configured to change the direction of light that has been propagated through the interior of the core 7 by 90° so that the light enters a light receiving portion of the optical element. The light reflecting surface 7a also has the inverse role of changing the direction of light that has been emitted from a light emitting portion of the optical element by 90° so that the light enters the interior of the core 7.

As illustrated in FIG. 1B, the electric circuit board E and optical waveguide W of the opto-electric hybrid board 10 are arranged so that left and right side surfaces of the electric circuit board E along the longitudinal direction of the optical waveguide W are on the inside of where left and right side surfaces of the optical waveguide W are located when viewed from above, while the optical waveguide W protrudes farther than the electric circuit board E leftward and rightward. This is a main feature of the present disclosure.

A method of manufacturing this opto-electric hybrid board 10 is described next (see FIG. 2 to FIG. 6).

Figure 2B:
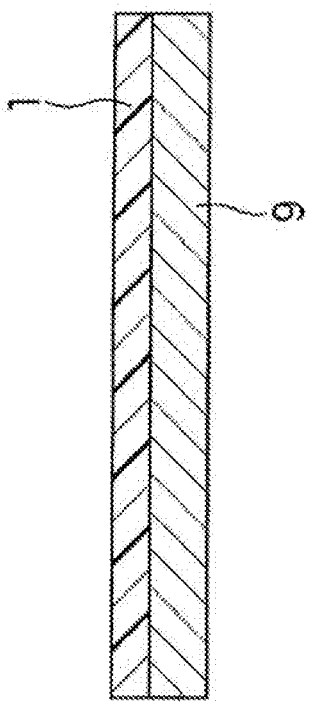
FIG. 2B is an explanatory sectional view taken along the line A-A' of FIG. 2A.
Figure 2D:
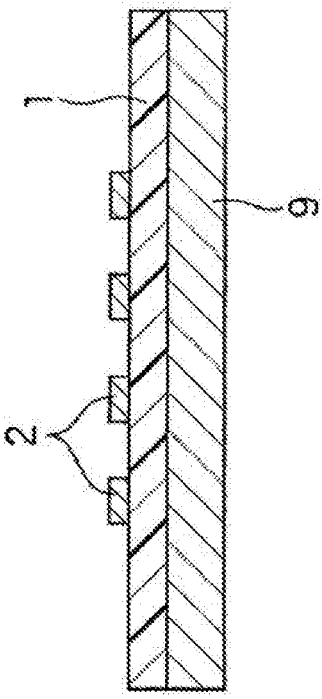
FIG. 2D is an explanatory sectional view taken along the line A-A' of FIG. 2C.
Figure 2A:
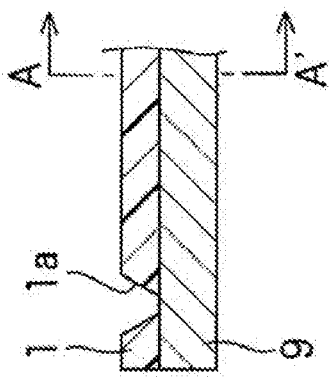
FIG. 2A is an explanatory diagram for illustrating a step of manufacturing an electric circuit board in a method of manufacturing the opto-electric hybrid board.

First, the metal layer 9 shaped like a flat board is prepared, photosensitive insulating resin made of polyimide or other materials is applied on a front surface of the metal layer 9, and the applied resin is formed by photolithography into the insulating layer 1 having a given pattern (see FIG. 2A and FIG. 2B, which is a sectional view taken along the line A-A' of FIG. 2A). In this example, a hole portion 1a where the front surface of the metal layer 9 is exposed is formed in order to form the earth electrode 2b, which is in contact with the metal layer 9. The thickness of the insulating layer 1 is set to, for example, from 3 µm to 50 µm. Examples of the material for forming the metal layer 9 include stainless steel, copper, silver, aluminum, nickel, chromium, titanium, platinum, and gold, and of those materials, stainless steel is preferred from the viewpoint of rigidity. The thickness of the metal layer 9 depends on which material is used. In the case where the material used is stainless steel, the metal layer 9 is set to a thickness of, for example, from 10 µm to 70 µm.

Figure 2C:
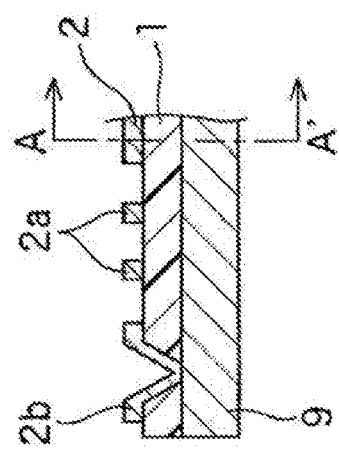
FIG. 2C is again an explanatory diagram for illustrating a step of manufacturing the electric circuit board.

Next, the electric wiring 2 (including the optical element installation pad 2a, the earth electrode 2b, and other pads; the same applies throughout the following description) is formed on the front surface of the insulating layer 1 by, for example, a semi-additive process as illustrated in FIG. 2C and FIG. 2D, which is a sectional view taken along the line A-A' of FIG. 2C. This process includes forming first a metal film (not shown) from copper, chromium, or other materials on the front surface of the insulating layer 1 by sputtering, non-electrolytic plating, or the like. The metal film serves as a seed layer (a layer that is the basis for the forming of an electrolytic plating layer) when electrolytic plating is performed later. The metal layer 9, the insulating layer 1, and the seed layer make up a stacked component, which is laminated with a photosensitive resist (not shown) on its top surface and its bottom surface. A hole portion having the pattern of the electric wiring 2 is formed in the photosensitive resist on the side where the seed layer is formed, thereby exposing a front surface portion of the seed layer at the bottom of the hole portion. Next, electrolytic plating is used to form a stack of electrolytic plating layers from copper or the like on the front surface portion of the seed layer that is exposed at the bottom of the hole portion. The photosensitive resist is then peeled with the use of an aqueous solution of sodium hydroxide or the like. A portion of the seed layer where the electrolytic plating layer is not formed is removed by soft etching. A stacked portion made up of the remaining seed layer and the electrolytic plating layer forms the electric wiring 2.

Next, photosensitive insulating resin made of polyimide or other materials is applied to a portion of the electric wiring 2 that excludes the optical element installation pad 2a and other pads to form the coverlay 3 by photolithography as illustrated in FIG. 3A and FIG. 3B, which is a sectional view taken along the line A-A' of FIG. 3A.

The electrolytic plating layer 4 is then formed on front surfaces of the optical element installation pad 2a and other pads as illustrated in FIG. 3C and FIG. 3D, which is a sectional view taken along the line A-A' of FIG. 3C. The electric circuit board E is formed in this manner.

Next, a stacked component made up of the metal layer 9 and the electric circuit board E is laminated with photosensitive resist on its top side and its bottom side. Hole portions are then formed by photolithography in the photosensitive resist on the rear side of the metal layer 9 (the side opposite from the electric circuit board E) in a portion where the metal layer 9 is unnecessary and a portion where a through hole for a light path is to be formed, thus exposing the rear surface of the metal layer 9 partially.

The exposed portions of the metal layer 9 are removed by etching with the use of an etching aqueous solution suitable for the metal material of the metal layer 9 (for example, an aqueous solution of ferric chloride in the case of the stainless steel layer), to thereby expose the insulating layer 1 in places from where the metal layer 9 is removed. Thereafter, the photosensitive resist is peeled with the use of an aqueous solution of sodium hydroxide or the like. This leaves the metal layer 9 only in areas that need to be reinforced and forms the light path through hole 5 at the same time as illustrated in FIG. 4A and FIG. 4B, which is a sectional view taken along the line A-A' of FIG. 4A.

The next step is for forming the optical waveguide W (see FIG. 1A) on the rear surface of the insulating layer 1 (on the rear surface of the metal layer 9 in places where the metal layer 9 is formed). First, the under cladding layer 6 is formed as illustrated in FIG. 4C and FIG. 4D, which is a sectional view taken along the line A-A' of FIG. 4C, by applying photosensitive resist, which is a material for forming the under cladding layer 6, on the rear surface of the insulating layer 1 and on the rear surface of the metal layer 9 (the bottom surface in the drawing), and the layer of applied resin is exposed and cured with the use of irradiated radiation. The under cladding layer 6 can be formed into a given pattern at this point by photolithography. The under cladding layer 6 is formed so as to enter and fill up the light path through hole 5 of the metal layer 9. The thickness of the under cladding layer 6 (the thickness measured from the rear side of the insulating layer 1) is normally set thicker than that of the metal layer 9. The series of work steps for forming the optical waveguide W is executed with the rear side of the insulating layer 1 where the metal layer 9 is formed facing upward. In the drawings, however, the insulating layer 1 is illustrated with the rear side facing downward.

Figure 5A:
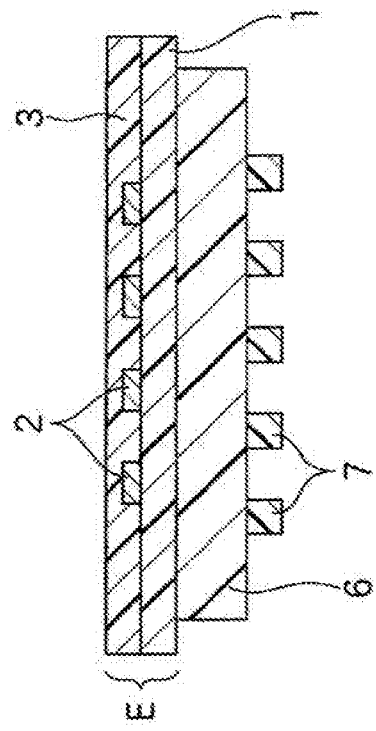
FIG. 5A is again an explanatory diagram for illustrating a step of manufacturing the optical waveguide.
Figure 5B:
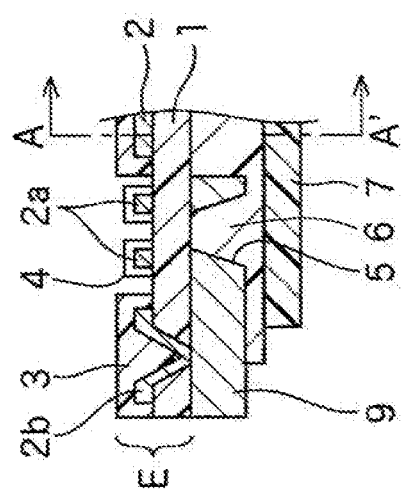
FIG. 5B is an explanatory sectional view taken along the line A-A' of FIG. 5A.

Next, the core 7 is formed in a given pattern by photolithography on a front surface (the bottom surface in the drawings) of the under cladding layer 6 as illustrated in FIG. 5A and FIG. 5B, which is a sectional view taken along the line A-A' of FIG. 5A. The core 7 is set to a thickness of, for example, from 3 µm to 100 µm and a width of, for example, from 3 µm to 100 µm. The material for forming the core 7 is, for example, photosensitive resin similar to the one used for the under cladding layer 6, and is higher in refractive index than the material for forming the under cladding layer 6 and the material for forming the over cladding layer 8, which is described later. The refractive index can be adjusted by, for example, selecting suitable types of materials for forming the under cladding layer 6, the core 7, and the over cladding layer 8, or by adjusting the composition ratio.

Figure 5C:
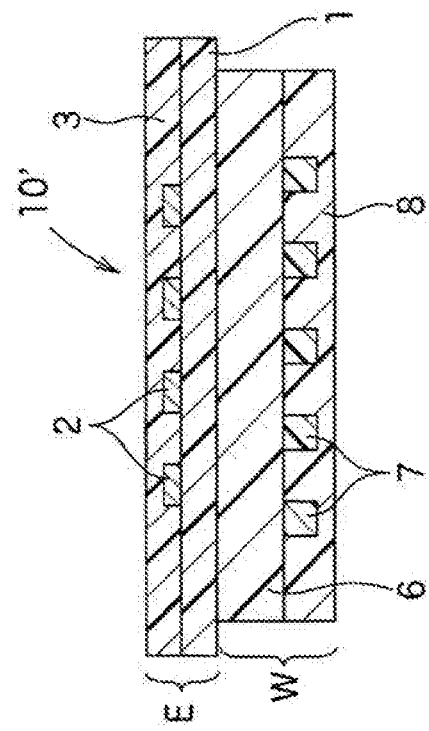
FIG. 5C is again an explanatory diagram for illustrating a step of manufacturing the optical waveguide.
Figure 5D:
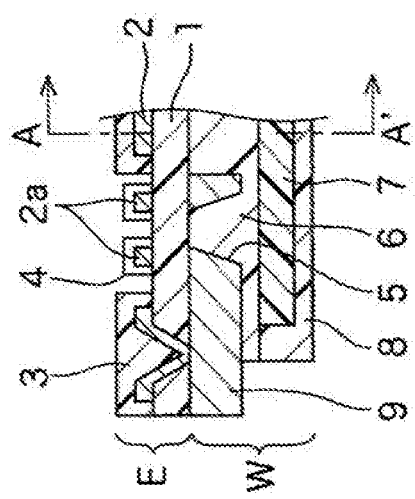
FIG. 5D is an explanatory sectional view taken along the line A-A' of FIG. 5C.
Figure 6:
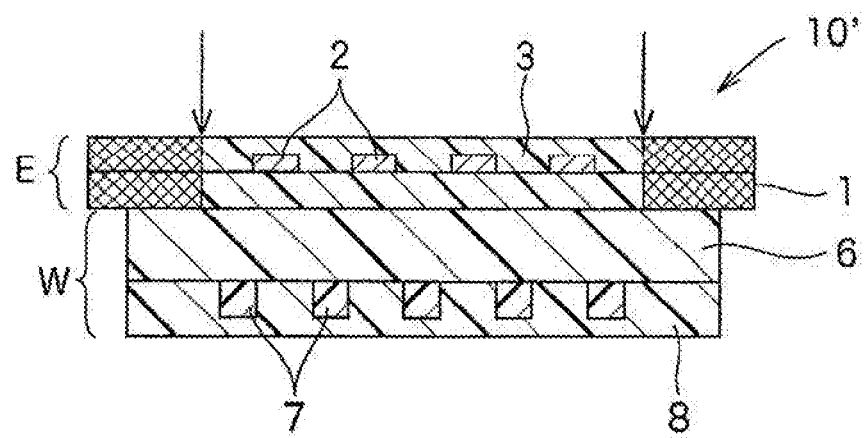
FIG. 6 is an explanatory diagram for illustrating a laser irradiation step in the method of manufacturing the opto-electric hybrid board.

The over cladding layer 8 is formed next by photolithography so as to overlap with the front surface (the bottom surface in the drawing) of the under cladding layer 6 and cover the core 7 as illustrated in FIG. 5C and FIG. 5D, which is a sectional view taken along the line A-A' of FIG. 5C. The optical waveguide W is formed in this manner. The thickness of the over cladding layer 8 (the thickness measured from the front surface of the under cladding layer 6) is set to, for example, a value equal to or more than the thickness of the core 7 and equal to or less than 300 µm. The material for forming the over cladding layer 8 is, for example, photosensitive resin similar to the one used for the under cladding layer 6.

Meanwhile, specific composition examples of the material for forming the optical waveguide W are shown below.
<Material for Forming Under Cladding Layer 6 and Over Cladding Layer 8>
Epoxy resin containing alicyclic skeleton (manufactured by Daicel Chemical Industries, Ltd., EHPE3150) 20 parts by weight Liquid long-chain bifunctional half-aliphatic epoxy resin (manufactured by DIC Corporation, EXA-4816)
  80 parts by weight
Photoacid generator (manufactured by ADEKA Corporation, SP170)
  2 parts by weight
Ethyl lactate (manufactured by Musashino Chemical Laboratory, Ltd.)
  40 parts by weight
<Material for Forming Core 7>
o-Cresol novolac glycidyl ether (manufactured by Nippon Steel & Sumikin Chemical Co., Ltd., YDCN-700-10)
  50 parts by weight
Bisphenoxy ethanol fluorene diglycidyl ether (manufactured by Osaka Gas Chemicals Co., Ltd., OGSOL EG) 50 parts by weight
Photoacid generator (manufactured by ADEKA Corporation, SP170)
  1 part by weight
Ethyl lactate (manufactured by Musashino Chemical Laboratory, Ltd.)
  50 parts by weight An opto-electric hybrid board 10' (an intermediate product in this example) is thus obtained which is shaped so that, as in the opto-electric hybrid board 10 of the related art illustrated in FIG. 17, the left and right edge portions of the electric circuit board E protrude farther outward than the left and right edge portions of the optical waveguide W on the left side and the right side along the longitudinal direction of the optical waveguide W. The left and right edge portions of the electric circuit board E (portions hatched in a mesh pattern in FIG. 6) are to be removed. Border portions between the edge portions to be removed and a portion of the electric circuit board E that is to be retained are irradiated with laser light to cut off the border portions as indicated by the arrows in FIG. 6. Thereafter, the left and right edge portions of the electric circuit board E which are to be removed are peeled off of the optical waveguide W to remove the edge portions. The opto-electric hybrid board 10 illustrated in FIG. 1 is thus obtained which is shaped so that the optical waveguide W protrudes farther than the electric circuit board E leftward and rightward.

Instead of cutting off only border portions between the left and right edge portions of the electric circuit board E which are to be removed and the to-be-retained portion of the electric circuit board E by laser irradiation and then removing the left and right edge portions by peeling, the entire left and right edge portions to be removed may be removed by laser irradiation.

The laser used in the laser irradiation described above needs to be capable of sublimating the constituent (polyimide or the like) of the electric circuit board E while not reacting with the constituent (epoxy resin or the like) of the optical waveguide W. For example, a YAG laser (ESI Model 5330, a product of Electro Scientific Industries, Inc.) is preferred. Partial removal of the electric circuit board E is accomplished without adversely affecting the optical waveguide W the slightest by using the YAG laser under, for example, conditions given below.
<One Example of Use Conditions of YAG Laser>
Laser spot diameter: 30 µm
Laser output power: 0.5 W
Frequency: 50 kHz
Scanning rate: 145 mm/s This opto-electric hybrid board 10 is configured so that the left and right edge portions of the optical waveguide W along the longitudinal direction of the optical waveguide W protrude farther than the left and right edge portions of the electric circuit board E sideways. Therefore, there is no fear that the electric circuit board E, which is relatively thin and vulnerable to damage, will be damaged from an external impact, unlike the electric circuit board of the related art illustrated in FIG. 17, and excellent quality can be steadily maintained for a long period of time.

Figure 7A:
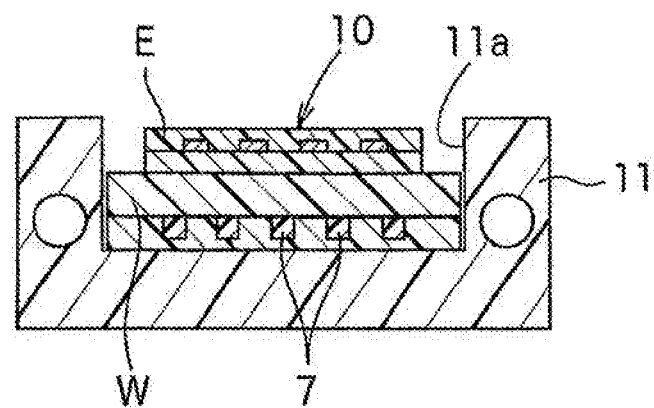
FIG. 7A and FIG. 7B are each an explanatory diagram about an effect of the opto-electric hybrid board.

In the case where this opto-electric hybrid board 10 is fit into the ferrule to be used as a connector, for example, the contour of the optical waveguide W, which is formed with the core as reference, fits snugly inside a recessed portion 11a of a ferrule 11 as illustrated in FIG. 7A. Accurate optical coupling is thus readily accomplished without causing misalignment of the core 7 of the optical waveguide W.

Figure 7B:
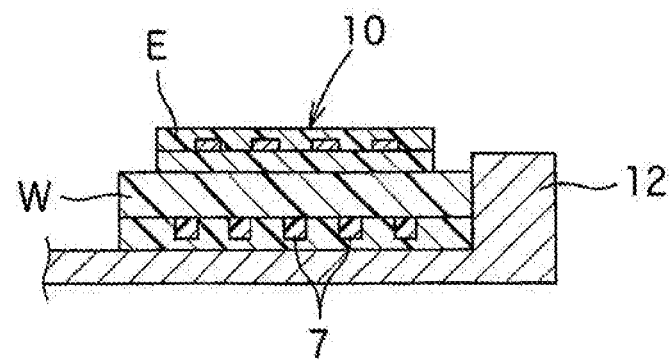

In applications other than as a connector, the opto-electric hybrid board 10 can be moved or transferred with the bottom surface and side surfaces of the optical waveguide W, which are relatively thick, being fit to a guide 12 as illustrated in, for example, FIG. 7B, when the product is tested for quality, conveyed, or transported. Accordingly, not only the electric circuit board E but also the protruding portions of the optical waveguide W have little chance of receiving an impact, and the quality of the core 7 and the electric circuit board E is not impaired. In addition, the opto-electric hybrid board 10 does not easily slide off from the guide 12 and can therefore be tested in a test process with the core 7 in its correct position, which reduces test errors.

While the electric circuit board E and the optical waveguide W in the example described above are set to thicknesses suitable for the use and required performance of the opto-electric hybrid board 10, it is usually preferred to set the optical waveguide W thicker than the electric circuit board E. It is particularly preferred to set the thickness of the electric circuit board E from around 3 µm to around 200 µm, and the thickness of the optical waveguide W from around 20 µm to around 500 µm. There is no fear that the opto-electric hybrid board 10 configured as this, unlike the related art, will impact on the insulated portion of the electric circuit board E despite being relatively thin and flexible throughout, and there is no fear of core misalignment when used as a connector, which means greater practical effects. The preferred thickness range of the electric circuit board E which is from 3 µm to 200 µm can be narrowed down to from 5 µm to 100 µm, and further down to from 5 µm to 50 µm.

It is preferred in the example described above to set the gap between a side edge of the electric circuit board E and a side edge of the optical waveguide W (indicated by D in FIG. 1B) viewed from above to 2 mm or less. When the gap D is larger than 2 mm, the portions of the optical waveguide W that stick out of the left and right edges of the electric circuit board E are too large, and an impact on such portions can adversely affect the propagation of light by generating distortion stress in the optical waveguide W, which is undesirable. Further, when a gap D is too large, it becomes difficult to cut the border portions alone and then peel the left and right edge portions in the removal process described above which uses laser irradiation. In such a case, the entire left and right edge portions having a relatively large area need to be removed by laser irradiation. This mode of removal process takes time and wastes a larger amount of material, which makes the process undesirable.

However, the gap may be 0 (zero) in the present disclosure, that is, the electric circuit board E and the optical waveguide W may have exactly the same width. This is because, if one of the two does not protrude farther than the other, impact on one is no more frequent than impact on the other. In this case, as in the example described above, it is preferred in terms of work efficiency to first fabricate the electric circuit board E so that the electric circuit board E has a shape in which the left and right edges of the electric circuit board E protrude from the left and right edges of the optical waveguide W and then remove the protruding portions last by laser irradiation.

The contour of the optical waveguide W viewed from above which is formed by the under cladding layer 6 and the over cladding layer 8 both in the example described above may be formed by the over cladding layer 8 alone or by the core 7 alone.

Figure 8A:
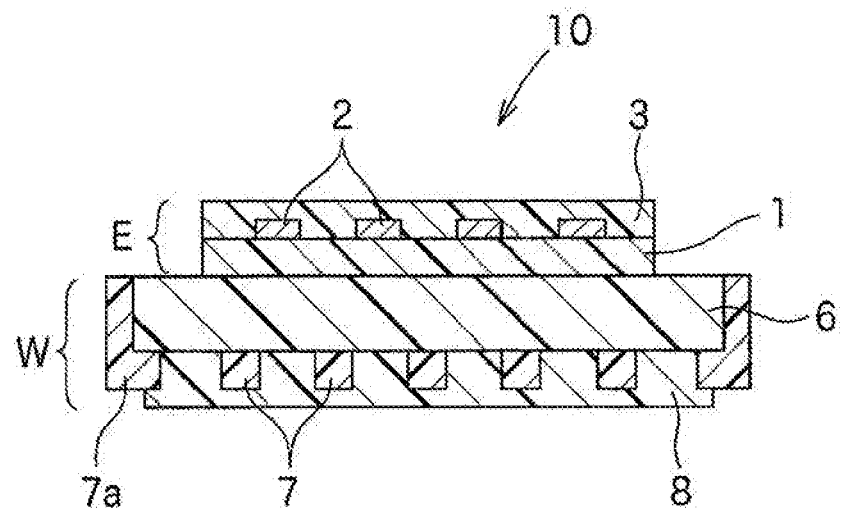
FIG. 8A and FIG. 8B are each an explanatory diagram for illustrating an opto-electric hybrid board according to another embodiment of the present disclosure.

The opto-electric hybrid board 10 that is illustrated in FIG. 8A is an example in which the contour of the optical waveguide W viewed from above is formed by the core 7. In this example, the core 7 includes a portion inside the optical waveguide W that is surrounded by the under cladding layer 6 and the over cladding layer 8, and a portion 7a, which is exposed to left and right side surfaces along the longitudinal direction of the optical waveguide W and which covers left and right side surfaces of the under cladding layer 6. On the left side and the right side along the longitudinal direction of the optical waveguide W, end surfaces of the respective layers are arranged so that the portion 7a, the under cladding layer 6, the over cladding layer 8, and the electric circuit board E appear in the order stated in a direction from the outside to the inside. The portion 7a is not a part of the path along which light travels, and has an effect of protecting the left and right edges of the opto-electric hybrid board 10 from an external impact. The quality of the opto-electric hybrid board 10 can thus be maintained steadily for a long period of time.

In addition, when the opto-electric hybrid board 10 configured as this is fit into a ferrule to be used as a connector, for example, the portion 7a formed with the core as reference can itself be used as a positioning guide. Optical coupling that is particularly precise is therefore accomplished without causing misalignment of a portion of the core 7 that serves as the light traveling path.

When a product is tested for quality, conveyed, or transported, using the portion 7a formed with the core as reference itself as a positioning guide in the handling of the product ensures that the product is tested or conveyed with the core 7 in its correct position. Test errors, conveyance troubles, and the like are therefore reduced (see FIG. 7B).

Figure 8B:
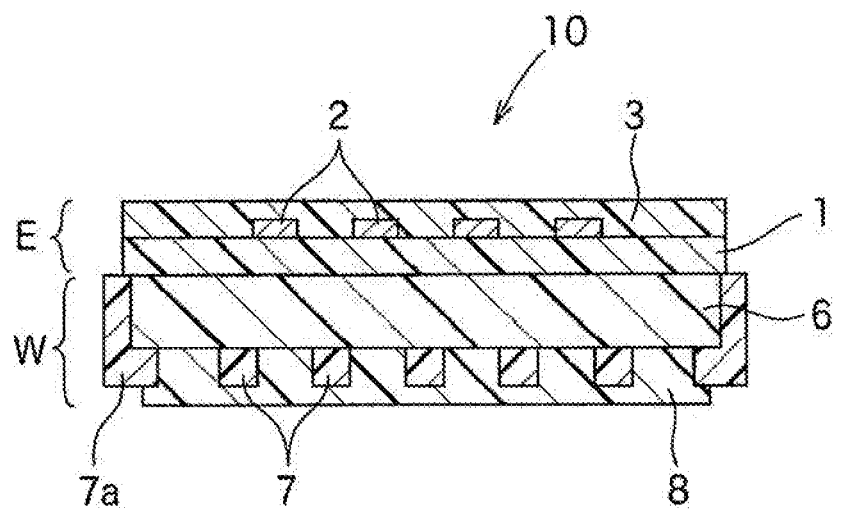

To give another example, the left and right end surfaces of the under cladding layer 6 formed on the rear surface of the insulating layer 1 of the electric circuit board E may be on the inside of the left and right end surfaces of the insulating layer 1 as illustrated in FIG. 8B. In this example, the end surfaces of the respective layers on the left side and the right side along the longitudinal direction of the optical waveguide W are arranged so that the portion 7a, the electric circuit board E, the under cladding layer 6, and the over cladding layer 8 appear in the order stated in a direction from the outside to the inside. This configuration has the same effects as those of the example described above.

Figure 9A:
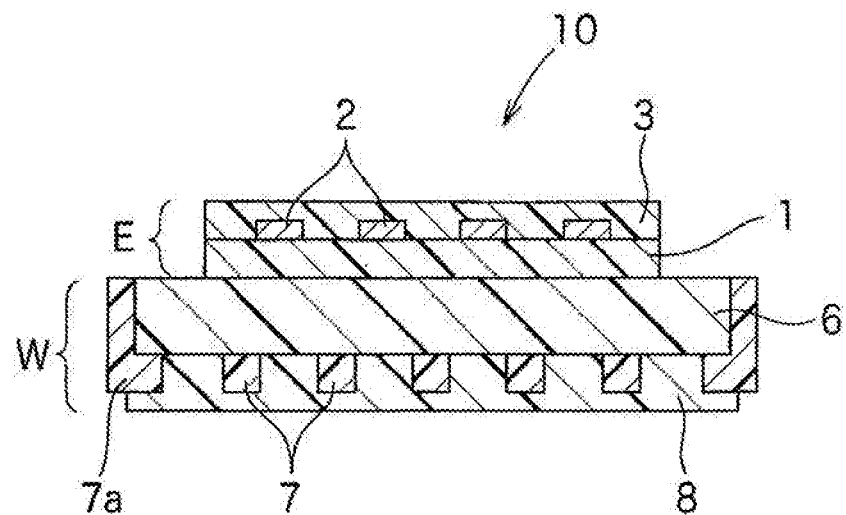
FIG. 9A and FIG. 9B are each an explanatory diagram for illustrating an opto-electric hybrid board according to yet another embodiment of the present disclosure.
Figure 9B:
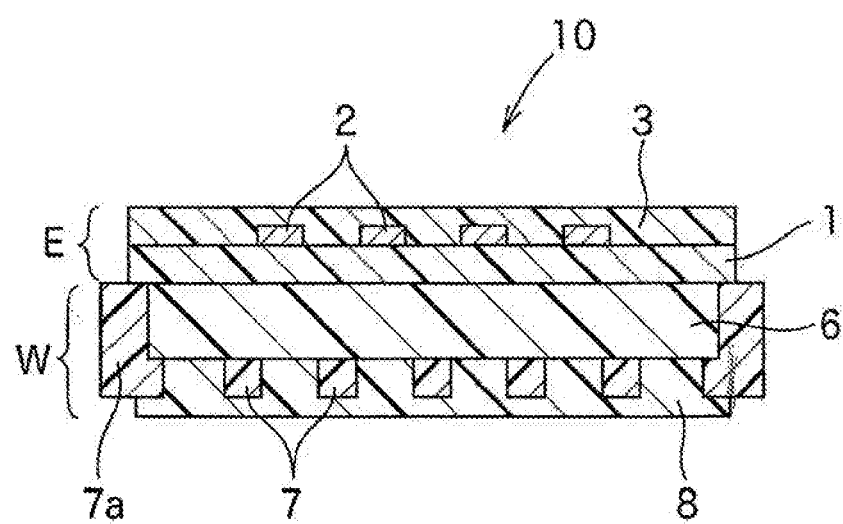

The configuration of FIG. 8A may be modified as illustrated in FIG. 9A, where the left and right end surfaces of the under cladding layer 6 are on the inside of the left and right end surfaces of the over cladding layer 8. In this example, the end surfaces of the respective layers on the left side and the right side along the longitudinal direction of the optical waveguide W are arranged so that the portion 7a, the over cladding layer 8, the under cladding layer 6, and the electric circuit board E appear in the order stated in a direction from the outside to the inside. The left and right end surfaces of the under cladding layer 6 may be on the inside of the left and right end surfaces of the insulating layer 1 as illustrated in FIG. 9B. In this example, the end surfaces of the respective layers on the left side and the right side along the longitudinal direction of the optical waveguide W are arranged so that the portion 7a, the electric circuit board E, the over cladding layer 8, and the under cladding layer 6 appear in the order stated in a direction from the outside to the inside. The configurations of FIG. 9 have the same effects as those of the example described above.

Figure 10A:
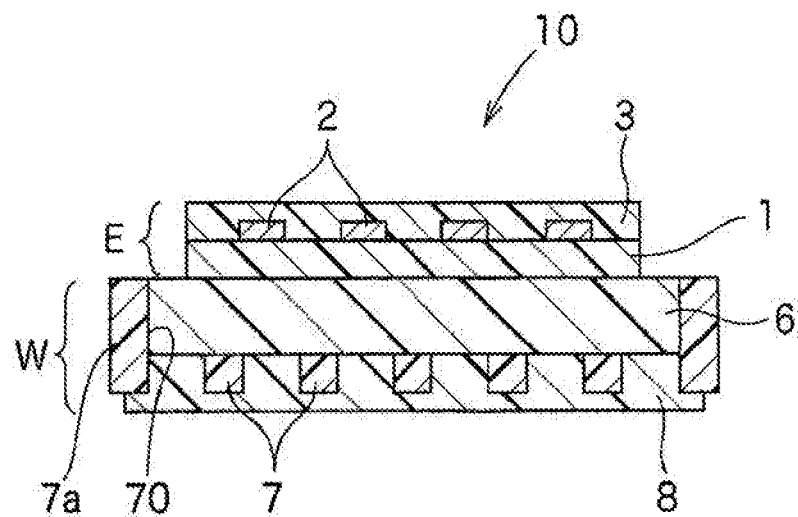
FIG. 10A and FIG. 10B are each an explanatory diagram for illustrating an opto-electric hybrid board according to another embodiment of the present disclosure.
Figure 10B:
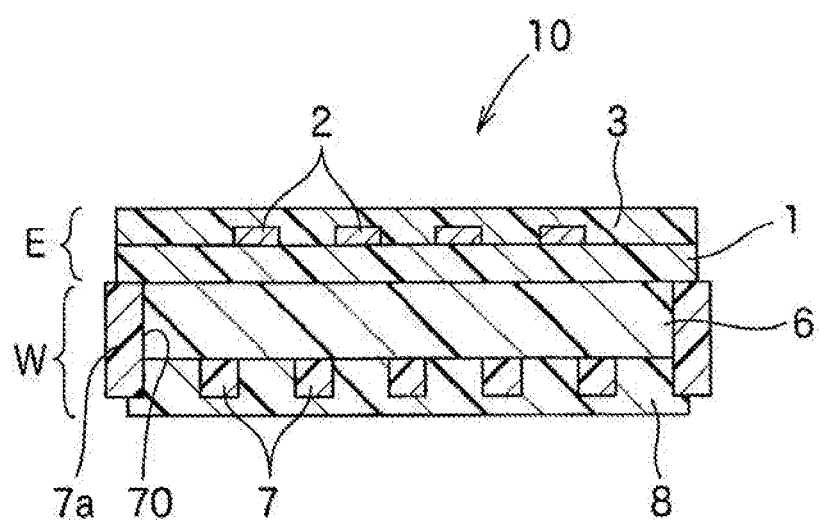

To give still another example, an inner side surface 70 of the portion 7a, which stretches over the under cladding layer 6 and the over cladding layer 8, may be flat as illustrated in FIG. 10A and FIG. 10B. In the example of FIG. 10A, the end surfaces of the respective layers are arranged so that the core portion 7a, the over cladding layer 8, the under cladding layer 6, and the electric circuit board E appear in the order stated in a direction from the outside to the inside. In the example of FIG. 10B, the end surfaces of the respective layers are arranged so that the core portion 7a, the electric circuit board E, the over cladding layer 8, and the under cladding layer 6 appear in the order stated in a direction from the outside to the inside. The configurations of FIG. 10 have the same effects as those of the example described above.

Figure 11A:
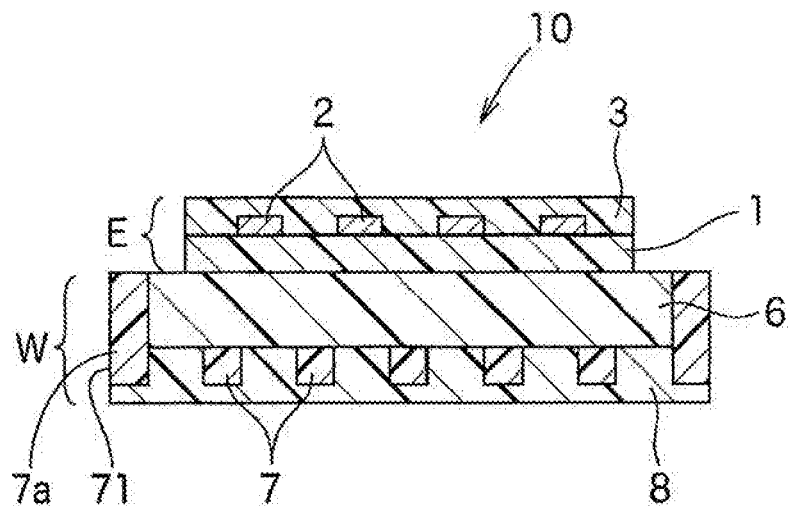
FIG. 11A and FIG. 11B are each an explanatory diagram for illustrating an opto-electric hybrid board according to yet another embodiment of the present disclosure.

As illustrated in FIG. 11A, the portion 7a, which stretches over the under cladding layer 6 and the over cladding layer 8, may have an outer side surface 71 that is flat as well as a flat inner side surface, and the outer side surface 71 and an outer side surface of the over cladding layer 8 on top of each other may form a flat surface. The end surfaces of the respective layers in this example are arranged so that the core portion 7a and the over cladding layer 8, the under cladding layer 6, and the electric circuit board E appear in the order stated in a direction from the outside to the inside. This configuration has the same effects as those of the example described above.

Figure 11B:
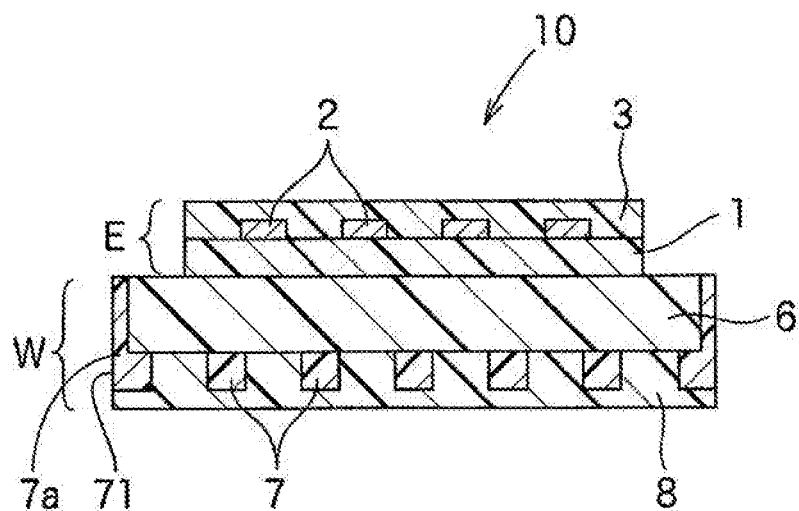

As illustrated in FIG. 11B, the outer side surface 71 of the portion 7a and the outer end surface of the over cladding layer 8 on top of each other may form a flat end surface shape as in the example of FIG. 11A also when inner portions of the core portion 7a, which is provided on each of the left and right side surfaces of the optical waveguide W, extend to the bottom side of the under cladding layer 6.

The end surfaces of the respective layers in this example are arranged so that the portion 7a and the over cladding layer 8, the under cladding layer 6, and the electric circuit board E appear in the order stated in a direction from the outside to the inside. This configuration has the same effects as those of the example described above.

Figure 12A:
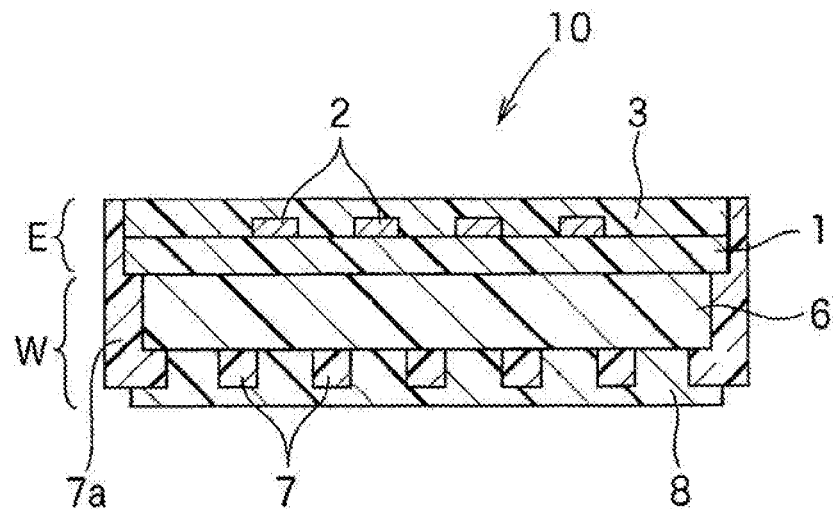
FIG. 12A and FIG. 12B are each an explanatory diagram for illustrating an opto-electric hybrid board according to another embodiment of the present disclosure.
Figure 12B:
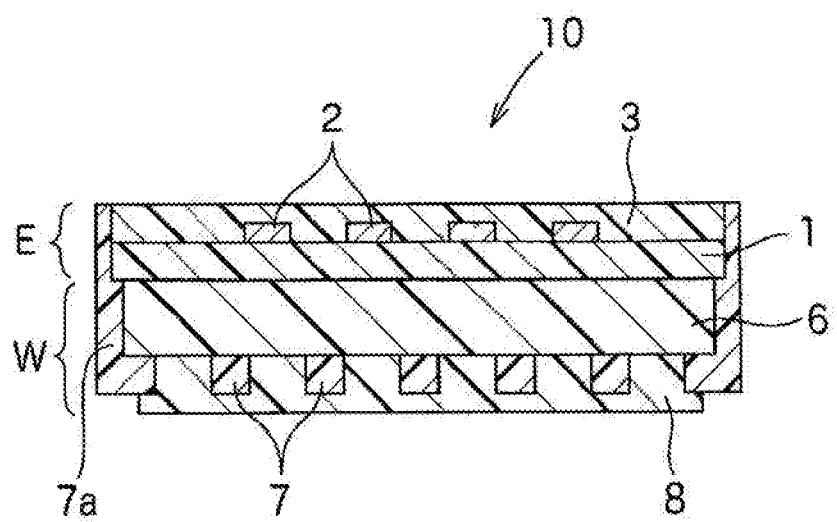

To give yet still another example, as illustrated in FIG. 12A, each portion 7a, which is exposed on one of the left and right side surfaces of the optical waveguide W, may further cover one of the left and right side surfaces of the electric circuit board E, which is located above the optical waveguide W. The end surfaces of the respective layers in this example are arranged so that the portion 7a, the electric circuit board E, the over cladding layer 8, and the under cladding layer 6 appear in the order stated. The configuration of FIG. 12A may also be modified so that the left and right end surfaces of the over cladding layer 8 are on the inside of the left and right end surfaces of the under cladding layer 6. An example of this configuration is illustrated in FIG. 12B. The end surfaces of the respective layers in this example are arranged so that the portion 7a, the electric circuit board E, the under cladding layer 6, and the over cladding layer 8 appear in the order stated. The configurations of FIG. 12 have the same effects as those of the example described above.

In the opto-electric hybrid board 10 that is configured so that the portions 7a are thus exposed on the left and right side surfaces of the optical waveguide W, the core portion that serves as the light traveling path and the portion 7a functioning as a positioning guide are formed in one process based on a single reference as already described. Using the end surfaces of the portions 7a as a positioning guide therefore makes the precision of positioning the core 7 higher than when the end surfaces of the under cladding layer 6 or the end surfaces of the over cladding layer 8 are used to position the core 7. This configuration is accordingly favorable.

The material that is selected often for the core 7 is, generally speaking, a material suitable for maintaining a rectangular shape compared to the under cladding layer 6 and the over cladding layer 8. It is therefore preferred in terms of maintaining shape to expose the portions 7a made from the core material on the left and right side surfaces of the optical waveguide W as described above. With the structure in which the core portion 7a covers the under cladding layer 6, in particular, there are fewer factors that cause the misalignment of the portions 7a, which serve as the left and right side surfaces of the optical waveguide W, and displacement due to the expansion and contraction of the material is accordingly reduced. Opto-electric hybrid boards that have in section the configurations illustrated in FIG. 8A, FIG. 8B, FIG. 9A, and FIG. 9B are therefore higher in the precision of positioning the core 7 than other configurations, and are even more favorable.

Figure 13A:
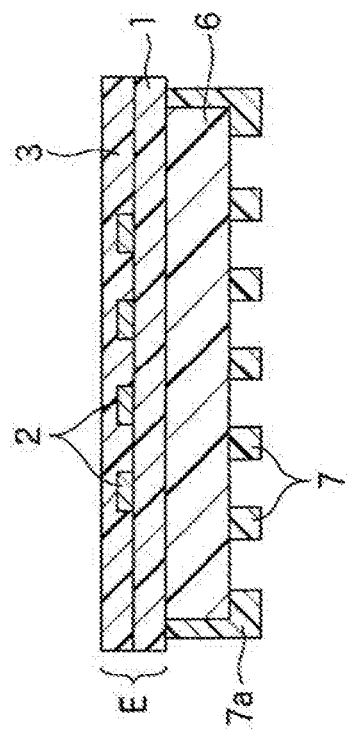
FIG. 13A is an explanatory diagram for illustrating a step of manufacturing an optical waveguide in a method of manufacturing the opto-electric hybrid board that is illustrated in FIG. 8A.
Figure 13B:
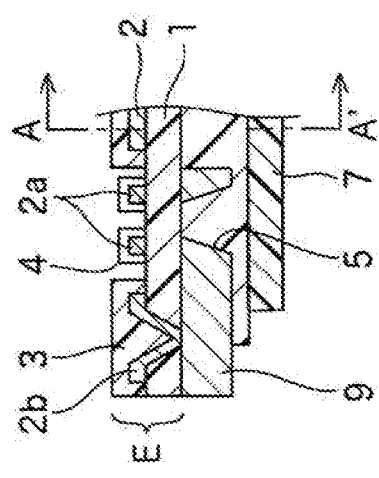
FIG. 13B is an explanatory sectional view taken along the line A-A' of FIG. 13A.

The opto-electric hybrid board 10 that is structured so that the portions 7a are thus exposed on the left and right side surfaces of the optical waveguide W can be obtained by a method that is mostly the same as the one used to obtain the configuration of FIG. 1. The method is described by taking the structure of FIG. 8A as an example. First, the under cladding layer 6, which is a constituent of the optical waveguide W, is formed on the rear side of the electric circuit board E as illustrated in FIG. 2 to FIG. 4. A core pattern having a contour that covers the left side and right side of the under cladding layer 6 is then formed as illustrated in FIG. 13A and FIG. 13B, which is a sectional view taken along the line A-A' of FIG. 13A. The core 7 having the portions 7a that are exposed on the left and right side surfaces of the optical waveguide W is obtained as a result.

Figure 13C:
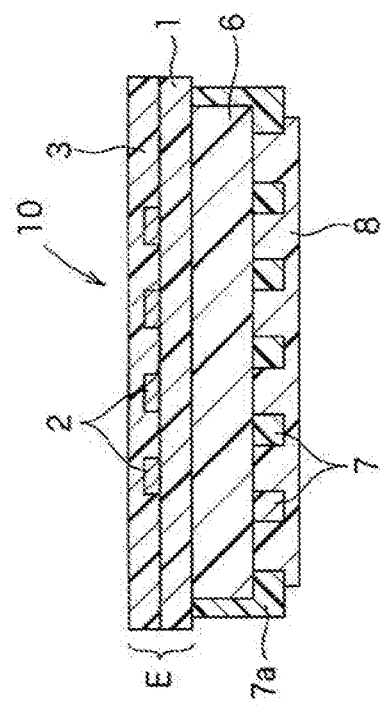
FIG. 13C is again an explanatory diagram for illustrating a step of manufacturing the optical waveguide.
Figure 13D:
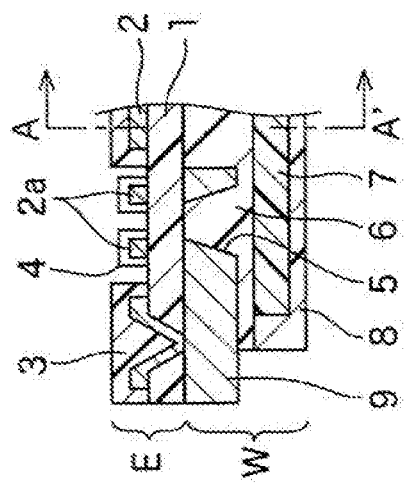
FIG. 13D is an explanatory sectional view taken along the line A-A' of FIG. 13C.
Figure 14:
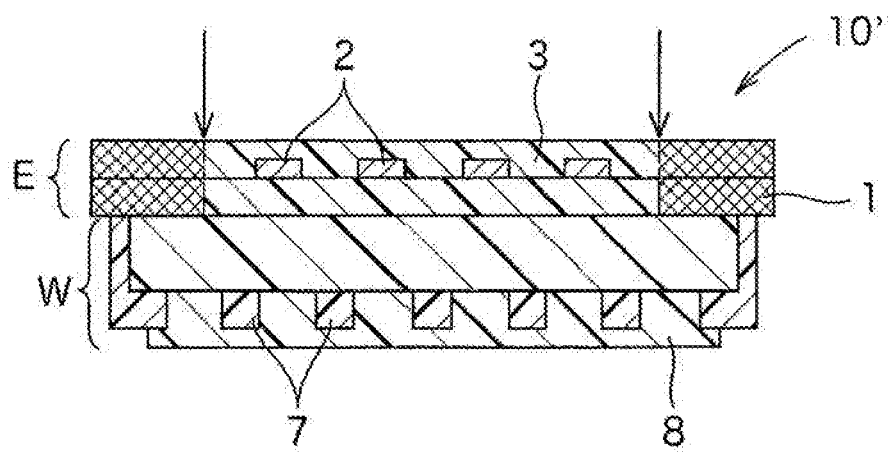
FIG. 14 is an explanatory diagram for illustrating a laser irradiation step in the method of manufacturing the opto-electric hybrid board.

Next, the over cladding layer 8 is formed on the front surface (the bottom surface in the drawings) of the core 7 as illustrated in FIG. 13C and FIG. 13D, which is a sectional view taken along the line A-A' of FIG. 13C. The left side and right side of the electric circuit board E are then removed by laser irradiation or other methods, thereby giving the opto-electric hybrid board 10 a shape in which the left and right edge portions of the optical waveguide W protrude leftward and rightward when viewed from the above as illustrated in FIG. 14. The opto-electric hybrid board 10 illustrated in FIG. 8A is obtained in this manner. Opto-electric hybrid boards different from one another in the arrangement order of the end surfaces of the respective layers as in the examples described above can be obtained by varying the patterns in which the layers are formed.

Figure 15A:
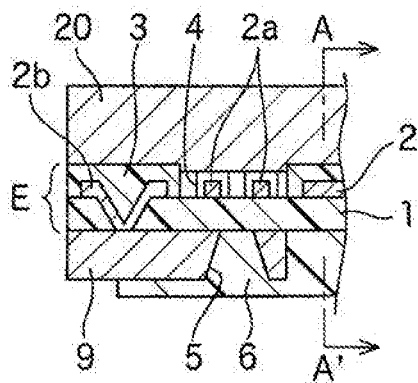
FIG. 15A is an explanatory diagram for illustrating a step of manufacturing an optical waveguide in a method of manufacturing the opto-electric hybrid board that is illustrated in FIG. 12A.
Figure 15B:
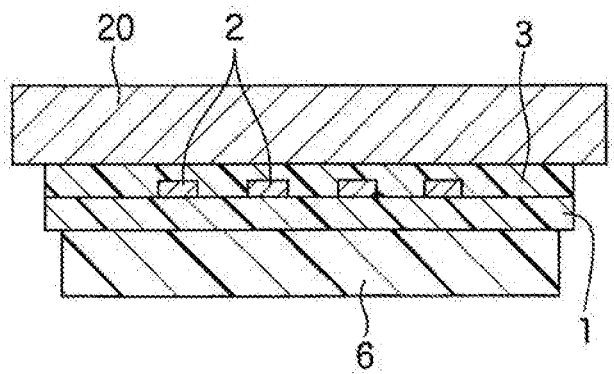
FIG. 15B is an explanatory sectional view taken along the line A-A' of FIG. 15A.

The opto-electric hybrid board 10 that has the configuration of FIG. 12A or FIG. 12B in which the portions 7a extend to cover the left and right end surfaces of the electric circuit board E, on the other hand, is obtained by a method described below, instead of the method described above. First, the electric circuit board E (with the metal layer 9) is formed in the same manner as in the example of FIG. 8A. A support layer 20 is then formed from a peelable sheet or the like on the front side of the electric circuit board E, which is followed by the forming of the under cladding layer 6 on the rear side of the electric circuit board E as illustrated in FIG. 15A and FIG. 15B, which is a sectional view taken along the line A-A' of FIG. 15A.

Figure 16A:
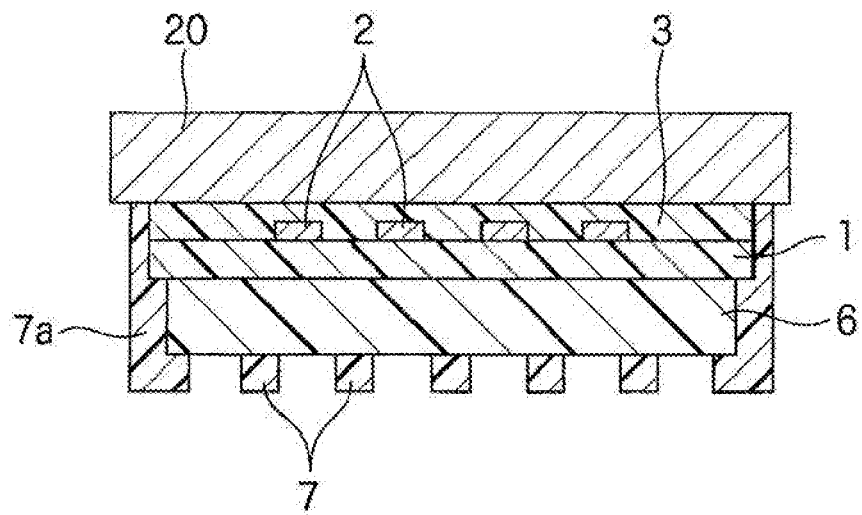
FIG. 16A and FIG. 16B are each again an explanatory diagram for illustrating a step of manufacturing the optical waveguide.

As illustrated in FIG. 16A, portions of the support layer 20 that protrude farther outward than the left and right side surfaces of the electric circuit board E are utilized to form the core 7 in a pattern that includes the portions 7a that cover the left and right side surfaces of the under cladding layer 6 and further cover the left and right side surfaces of the electric circuit board E, which is located above the under cladding layer 6.

Figure 16B:
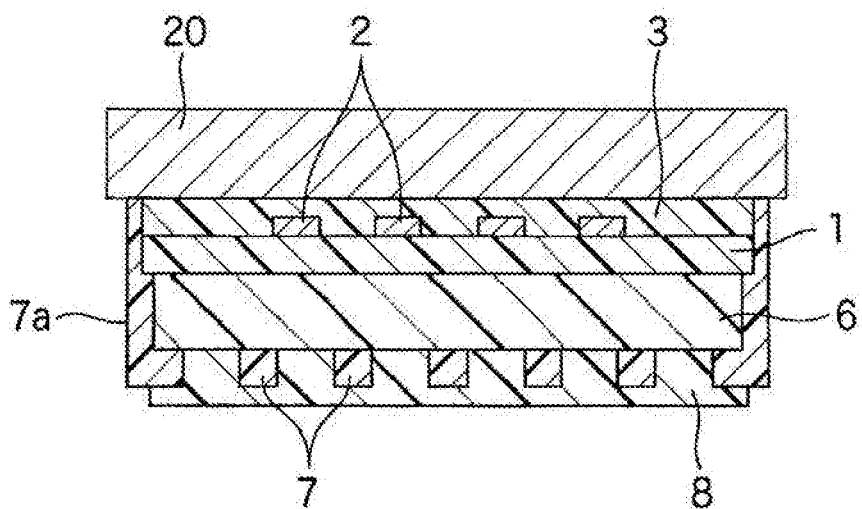

The over cladding layer 8 having a given shape is then formed on the front surface (the bottom surface in the drawing) of the core 7 as illustrated in FIG. 16B to form the optical waveguide W. Thereafter, the support layer 20 is removed from the electric circuit board E, thereby obtaining the opto-electric hybrid board 10 that has a configuration in which the portions 7a extend to cover the left and right end surfaces of the electric circuit board E. The support layer 20 may be made of any material as long as the support layer 20 can be removed easily from the electric circuit board E by peeling or the like, and does not adversely affect the electric circuit board E. When to form the support layer 20 and when to remove the support layer 20 are not limited to the timing of the example described above, and it is sufficient if the support layer 20 is present at least when the core 7 is formed in a pattern that includes the portions 7a.

This manufacturing method is economical and high in manufacturing efficiency because an opto-electric hybrid board that has the special shape described above can readily be obtained by simply removing the support layer 20, which is provided on the front side of the electric circuit board E at suitable timing, after the core of the optical waveguide is formed so as to cover the left and right side surfaces of the electric circuit board E with the use of the support layer 20.

EXAMPLES

Examples of the present disclosure are described next in conjunction with Comparative Examples.

Examples 1 to 9, Comparative Example 1

Opto-electric hybrid boards having sectional shapes that are shown in Table 1 were created in the manner described above from materials common to one another under conditions that gave layer thicknesses common to one another. An end surface of each of the opto-electric hybrid boards was observed under a measuring microscope (MF-B2017D, a product of Mitutoyo Corporation) to calculate the center in a width direction of the end surface. The central coordinates of the core 7 were measured from the calculated center, and a deviation from design values was calculated as a pseudo "misalignment width (μm)". For each Example, five samples were created to obtain an average of the calculated values of the five samples. Results thereof are shown in Table 1 alongside.

TABLE 1

Figure 17:
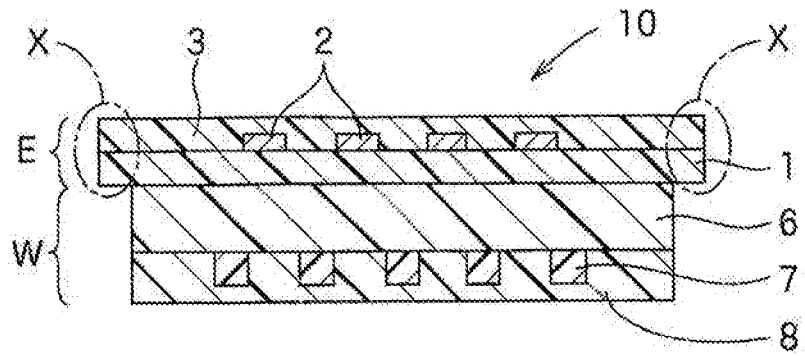
FIG. 17 is a schematic vertical sectional view for illustrating an example of an opto-electric hybrid board according to the related art.
Figure 18A:
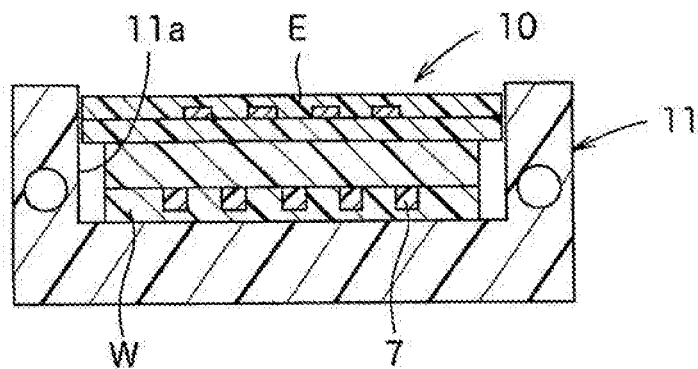
FIG. 18A and FIG. 18B are each an explanatory diagram about a problem of the opto-electric hybrid board according to the related art.
Figure 18B:
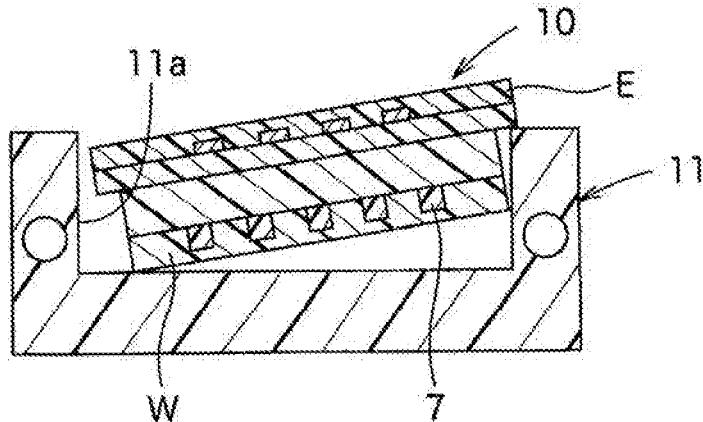

|  | Sectional shape | Misalignment width (μm) |
| --- | --- | --- |
| Example 1 | FIG. 1B | 20 |
| Example 2 | FIG. 8A | 12 |
| Example 3 | FIG. 8B | 12 |
| Example 4 | FIG. 9A | 12 |
| Example 5 | FIG. 9B | 12 |
| Example 6 | FIG. 10A | 15 |
| Example 7 | FIG. 10B | 15 |
| Example 8 | FIG. 11A | 15 |
| Example 9 | FIG. 12A | 18 |
| Comparative Example 1 | FIG. 17 | 41 |

It is understood from the results given above that connectors that use the opto-electric hybrid boards of Example 1 to Example 9, in particular, Example 2 to Example 5, are very high in alignment precision compared to one that uses the opto-electric hybrid board of Comparative Example 1.

Although specific modes of the present disclosure have been described in Examples above, Examples are for illustrative purposes only and are not to be construed as limitative. It is intended that various modifications apparent to a person skilled in the art fall within the scope of the present disclosure.

The present disclosure is applicable to an opto-electric hybrid board that is easy to handle and has a stable quality owing to the reduced chance of an electric circuit board portion being damaged.

REFERENCE SIGNS LIST

E electric circuit board
W optical waveguide
1 insulating layer
2 electric wiring
7 core
10 opto-electric hybrid board

The invention claimed is:

1. A ribbon-shaped opto-electric hybrid board, comprising:
a ribbon-shaped electric circuit board comprising an insulating layer and electric wiring, which is formed on a front surface of the insulating layer; and
a ribbon-shaped optical waveguide comprising a cladding layer and a core, the optical waveguide being formed on a rear side of the electric circuit board,
wherein a longitudinal direction of the electric circuit board and a longitudinal direction of the optical waveguide both correspond to a direction in which the core extends,
wherein the electric circuit board and the optical waveguide are configured so that the outermost left and right edges of the electric circuit board are on an inside of the outermost left and right edges of the optical waveguide, when viewed along an axis parallel to the longitudinal direction of the electric circuit board and the longitudinal direction of the optical waveguide, and
wherein the electric circuit board is disposed on the optical waveguide and is a nearest electric circuit board to the optical waveguide, in a thickness direction of the opto-electric hybrid board.

2. The ribbon-shaped opto-electric hybrid board according to claim 1, wherein the optical waveguide has a thickness greater than a thickness of the electric circuit board.

3. The ribbon-shaped opto-electric hybrid board according to claim 1, wherein the electric circuit board has a thickness of from 3 μm to 200 μm, and the optical waveguide has a thickness of from 20 μm to 500 μm.

4. The ribbon-shaped opto-electric hybrid board according to claim 1,
wherein the core of the optical waveguide comprises a core portion that is surrounded by the cladding layer and which propagates light, and
wherein the ribbon-shaped opto-electric hybrid board further comprises portions which do not propagate light, the portions which do not propagate light being made from a same material as the core portion and being exposed on outermost left and right side surfaces of the optical waveguide, when viewed along the axis parallel to the longitudinal direction of the electric circuit board and the longitudinal direction of the optical waveguide, and serve as a positioning guide.

5. The ribbon-shaped opto-electric hybrid board according to claim 1,
wherein the core of the optical waveguide comprises a core portion that is surrounded by the cladding layer and which propagates light,
wherein the ribbon-shaped opto-electric hybrid board further comprises portions which do not propagate light, the portions which do not propagate light being made from a same material as the core portion and being exposed on outermost left and right side surfaces of the optical waveguide, when viewed along the axis parallel to the longitudinal direction of the electric circuit board and the longitudinal direction of the optical waveguide, and
wherein the portions which do not propagate light cover left and right side surfaces of the electric circuit board, when viewed along the axis parallel to the longitudinal direction of the electric circuit board and the longitudinal direction of the optical waveguide, and serve as a positioning guide.

6. A method of manufacturing an opto-electric hybrid board, comprising:
preparing an electric circuit board, the electric circuit board comprising an insulating layer and an electric wiring which is formed on a front surface of the insulating layer; and
forming an optical waveguide on a rear side of the electric circuit board, the optical waveguide comprising a cladding layer and a core,
wherein the forming of the optical waveguide on the rear side of the electric circuit board comprises:

forming the optical waveguide so that the optical waveguide has a shape in which outermost left and right edges of the optical waveguide in a longitudinal direction of the optical waveguide protrude farther outward than outermost left and right edges of the electric circuit board in a longitudinal direction of electric circuit board, the longitudinal direction of the electric circuit board and the longitudinal direction of the optical waveguide both corresponding to a direction in which the core extends; and then performing laser irradiation from above the electric circuit board to process and remove left and right edge portions of the electric circuit board in the longitudinal direction of the electric circuit board, thereby forming the optical waveguide and the electric circuit board so that the outermost left and right edges of the electric circuit board in the longitudinal direction of the electric circuit board are on an inside of the outermost left and right edges of the optical waveguide in the longitudinal direction of the optical waveguide.

7. The method of manufacturing an opto-electric hybrid board according to claim 6, wherein the optical waveguide has a thickness greater than a thickness of the electric circuit board.

8. The method of manufacturing an opto-electric hybrid board according to claim 6, wherein the electric circuit board has a thickness of from 3 μm to 200 μm, and the optical waveguide has a thickness of from 20 μm to 500 μm.

9. The method of manufacturing an opto-electric hybrid board according to claim 6, wherein the core of the optical waveguide comprises (i) a core portion that is surrounded by the cladding layer, and (ii) portions that are exposed on outermost left and right side surfaces of the optical waveguide in the longitudinal direction of the optical waveguide and that serve as a positioning guide.

10. A method of manufacturing an opto-electric hybrid board, comprising:

preparing an electric circuit board, the electric circuit board comprising an insulating layer and an electric wiring which is formed on a front surface of the insulating layer; and forming an optical waveguide on a rear side of the electric circuit board, the optical waveguide comprising a cladding layer and a core, wherein the core comprises (i) a core portion that is surrounded by the cladding layer, and (ii) portions that are exposed on outermost left and right side surfaces of the optical waveguide in the longitudinal direction of the optical waveguide and that serve as a positioning guide, wherein the forming of the optical waveguide on the rear side of the electric circuit board comprises:

forming a support layer, at least before the core is formed, on a front side of the electric circuit board so that the support layer has a shape in which the support layer protrudes farther outward than outermost left and right edges of the electric circuit board in a longitudinal direction of the electric circuit board;

forming the (i) core portion and (ii) the portions that are exposed on the outermost left and right sides of the optical waveguide in the longitudinal direction of the optical waveguide, from a same material as the core, on a rear side of the support layer, the portions (ii) protruding farther outward than the outermost left and right edges of the electric circuit board in the longitudinal direction of the electric circuit board and covering left and right side surfaces of the electric circuit board in the longitudinal direction of the electric circuit board; and then removing the support layer from the electric circuit board, wherein the longitudinal direction of the electric circuit board and the longitudinal direction of the optical waveguide both corresponding to a direction in which the core extends.

\* \* \* \* \*